United States Patent [19]

Thomas

[11] Patent Number: 5,382,317
[45] Date of Patent: Jan. 17, 1995

[54] METHOD OF SELECTIVELY APPLYING A COATING TO A BILEVEL SUBSTRATE

[75] Inventor: Patrick A. Thomas, Maplewood, Minn.

[73] Assignee: Minnesota Mining and Manufacturing Company, St. Paul, Minn.

[21] Appl. No.: 198,837

[22] Filed: Feb. 18, 1994

[51] Int. Cl.6 .............................................. B05D 5/12
[52] U.S. Cl. ........................... 156/654; 427/58; 427/355; 427/358; 427/384
[58] Field of Search ............... 427/355, 358, 58, 384; 428/1; 156/654

[56] References Cited

U.S. PATENT DOCUMENTS

| | | | |
|---|---|---|---|
| 3,941,901 | 3/1976 | Harsch | 427/358 |
| 4,271,209 | 6/1981 | DePalma et al. | 427/358 |
| 4,732,830 | 3/1988 | DiSanto et al. | 430/20 |
| 4,948,706 | 8/1990 | Sugihara et al. | 430/311 |
| 5,106,441 | 4/1992 | Brosig et al. | 428/1 |
| 5,116,704 | 5/1992 | Kwon | 430/3 |
| 5,120,623 | 6/1992 | Brosig et al. | 430/20 |
| 5,169,737 | 12/1992 | Haws | 430/7 |
| 5,187,601 | 2/1993 | Yamazaki et al. | 359/54 |

*Primary Examiner*—Shrive Beck
*Assistant Examiner*—Benjamin L. Utech
*Attorney, Agent, or Firm*—Gary L. Griswold; Walter N. Kirn; Eric D. Levinson

[57] ABSTRACT

A method of selectively applying a coating to either the upper or lower surface of a bilevel substrate. The method includes the steps of applying a layer of photoresist over the substrate and moving a doctor blade across the substrate, thereby removing the photoresist from the upper surface while leaving it on the lower surface. The photoresist is then hardened by drying and/or curing. The photoresist is then used to facilitate removal of the coating from either the upper or lower surface of the bilevel substrate.

16 Claims, 2 Drawing Sheets

METHOD OF SELECTIVELY APPLYING A COATING TO A BILEVEL SUBSTRATE

FIELD OF THE INVENTION

The present invention relates generally to methods of applying coatings, and more particularly to methods of selectively applying a coating to the upper or lower surface of a bilevel substrate.

BACKGROUND OF THE INVENTION

It is known that a photosensitive material, such as photoresist, may be employed to selectively apply a coating to portions of a substrate. Such methods typically begin by depositing a coating, such as a conductor, onto a substrate. This coating typically covers the entire substrate surface and requires selective removal in order to pattern the coating. Next, a photoresist is coated onto the substrate. A mask is then placed over the substrate to define the desired pattern. Light rays are directed toward the mask, and those portions of the photoresist that are not covered by the mask are exposed to the light while portions which are covered by the mask are not. Either the exposed or unexposed portions of the photoresist are then removed, depending upon whether a "positive" or "negative" type of photoresist is used. Those portions of the coating which are no longer covered by the photoresist may then be removed, such as by chemical etching or other means. The remaining photoresist is then removed, leaving only the coating covering the desired locations on the substrate.

The mask method described above may also be used to remove a coating from either the upper or lower levels of a bilevel substrate. However, this requires both the creation of a mask capable of achieving a pattern identical to the physical pattern of the bilevel substrate and the ability to properly align the mask in registration with the physical pattern of the substrate surface. The disadvantage of this approach is that as the distances between the raised portions of the substrate become increasingly small (e.g., on the order of 500 μm or less), the problem of aligning the mask and the substrate surface becomes increasingly large. In addition, the processes of mask alignment, exposure, and photoresist removal are both time consuming and prone to produce defects in the resultant patterned coating due to process variability.

SUMMARY OF THE INVENTION

The present invention includes a method of applying a coating to the upper surface of a bilevel substrate, such as a liquid crystal display panel having parallel channels. First, a layer of liquid material, such as a photosensitive material (e.g., photoresist) is applied over the bilevel substrate. Next, a leveling device, such as a doctor blade, is moved across the bilevel substrate so that the liquid material on the upper surface is removed while the liquid material in the channels is not. The liquid material in the channels is then hardened, e.g., by drying and/or curing, and a coating, such as an electrically conductive coating like indium tin oxide (ITO), is deposited on the bilevel substrate. Finally, the hardened material (photoresist) is removed from the channels, thereby removing the coating from the channels, whereby the coating remains only on the upper surface of the bilevel substrate.

The present invention also includes a method of applying a coating to the lower surface of a bilevel substrate, such as a liquid crystal display panel having parallel ridges. First, a coating, such as ITO, is applied over the bilevel substrate. Next, a layer of liquid material (e.g., photoresist) is applied over the coating. Then, a leveling device (e.g., doctor blade) is moved across the bilevel substrate so that the photoresist on top of the ridges is removed while the photoresist between the ridges is not. The photoresist is then hardened, e.g., by curing and/or drying. Those portions of the coating that are not covered by the photoresist, i.e., those portions on the tops of the ridges, are then removed, e.g., by chemical etching. The photoresist remaining between the ridges is then removed. Thus, the coating remains only between the ridges.

DETAILED DESCRIPTION

The present invention relates to a method of depositing a coating on either the upper or lower surface of a bilevel substrate. The method for depositing the coating on the upper surface will be described first.

Figure 1A:
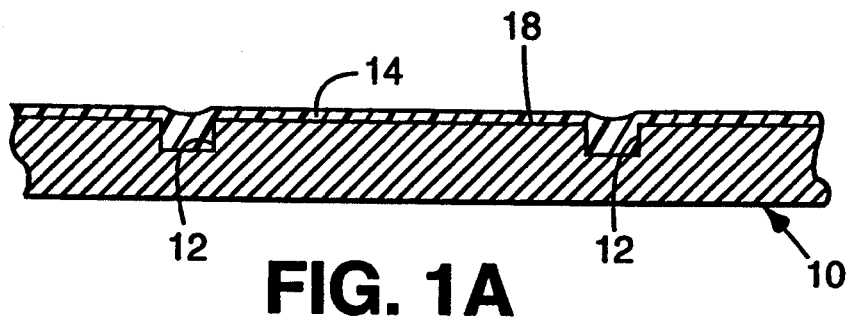
FIGS. 1A–1D show the steps of depositing a coating on the areas between channels in a substrate.

A schematic cross-sectional view of a bilevel substrate 10 is shown in FIG. 1A. Substrate 10 has a plurality of parallel, rectangular channels 12 separating flat surface 18. A layer of liquid material 14 is applied over substrate 10, so that flat surface 18 and channels 12 are covered by the material, as shown in FIG. 1A. Material 14 may be applied by gravure roll, doctor blade, knife edge, or other conventional methods. Liquid material 14 may be a photosensitive material, such as a photoresist, or a non-photosensitive material such as an ink or solvent soluble polymer. A requirement of liquid material 14 is that it be removable later in the process by solvent stripping, chemical etching, or other means. A photoresist material may be preferable since its solubility can be controlled by exposure to light.

Figure 1B:
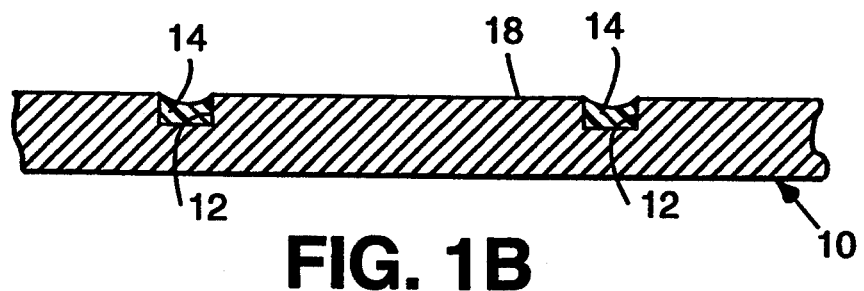

Next, liquid material 14 is removed from flat surface 18 by a leveling device, such as a doctor blade, as shown in FIG. 1B. This cleanly removes liquid material 14 from flat surface 18, and may form a slight meniscus of the liquid material in channels 12. Liquid material 14 is then hardened by drying and/or curing.

Figure 1C:
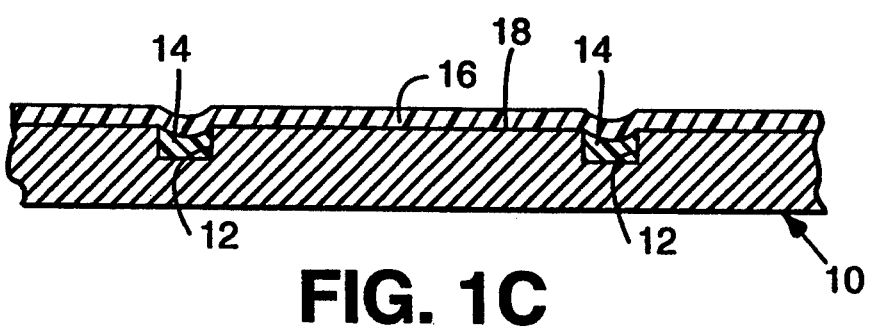

A coating 16 is then applied over flat surface 18 and material 14 in channels 12, as shown in FIG. 1C. Coating 16 is preferably a thin film that is transparent and electrically conductive, such as indium tin oxide. Coating 16 may be deposited by sputter coating, evaporation, chemical vapor deposition, or other known deposition techniques. Coating 16 should cover flat surface 18 as well as material 14 remaining in channels 12.

Coating 16 need not be optically transparent under any of the following conditions: (1) liquid material 14 is not photosensitive, (2) the liquid material is photosensitive and can be exposed (a) prior to deposition or (b) after deposition if the exposure can be done from the backside of substrate 10 where the substrate is UV transparent, or (3) the coating is UV transparent but not optically transparent.

Figure 1D:
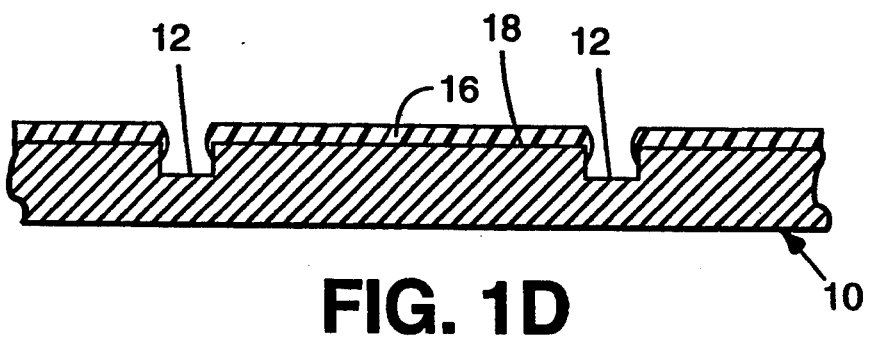

Material 14 is then removed by conventional techniques, such as chemical stripping or blanket exposure and development. The exposure of material 14 may be performed before applying coating 16, depending on the properties of substrate 10, the material, and the coating. The removal of material 14 in channels 12 results in the removal of coating 16 from the channels, as shown in FIG. 1D.

The result is that coating 16 remains only on flat surface 18, as well as slightly down the side walls of channels 12 since liquid material 14 originally formed a slight meniscus in the channels. If coating 16 is electrically conductive, then the result is a plurality of electrically isolated conductive areas 16 extending along flat surface 18. This can be useful for producing a microstructured substrate with raised, electrically isolated conductive lines useful for microcircuitry, or selective contact to other surfaces. In a liquid crystal display (LCD) application, the upper patterned surface could be used as the active pixel area in an LCD. Patterning the conductor would produce substrate regions that are isolated and individually addressable. If coating 16 is not conductive, the result is a microstructured substrate with physically isolated lines forming a pattern precisely defined by the substrate microstructure. This structure could be used as a mask or other device requiring a patterned surface.

The method of the present invention for depositing a coating on the lower surface at a bilevel substrate will now be described with reference to FIGS. 2A–2E.

Figure 2A:
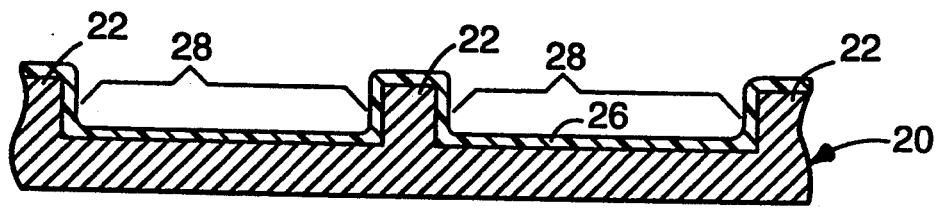
FIGS. 2A–2E show the steps of depositing a coating between the ridges on a substrate.

A schematic cross-sectional view of a bilevel substrate 20 is shown in FIG. 2A. Substrate 20 has a plurality of parallel, rectangular, flat-topped ridges 22 separated by areas 28. The tops of ridges 22 should be coplanar. Coating 26 is applied over substrate 20 so that ridges 22 and the areas 28 between the ridges are covered by the coating. Coating 26 may be deposited by conventional techniques.

Figure 2B:
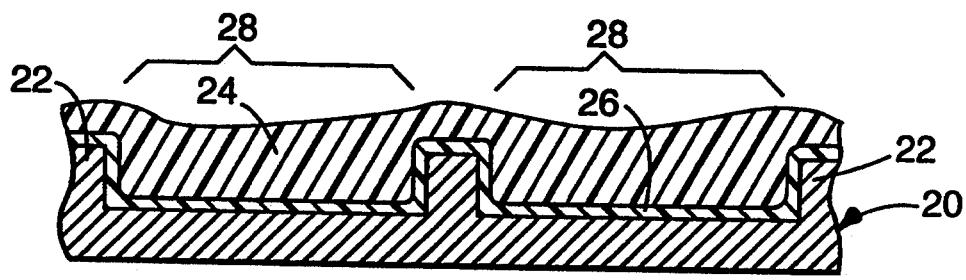

Liquid material 24 is then applied over coating 26, as shown in FIG. 2B. Liquid material layer 24 may be applied by gravure roll, doctor blade, knife edge, or other conventional methods.

Figure 2C:
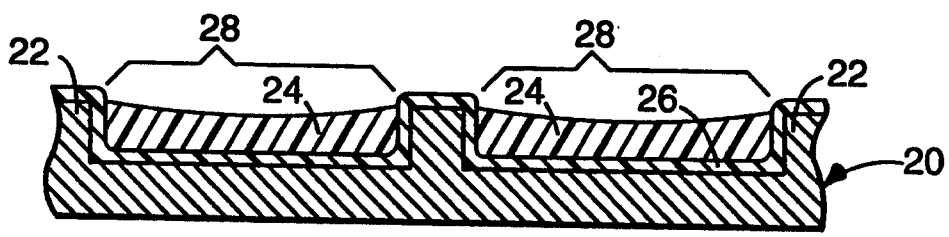

Next, liquid material 24 is removed from the portions of coating 26 that are positioned over ridges 22, by a leveling device, such as a doctor blade, as shown in FIG. 2C. This forms a slight meniscus of liquid material 24 in areas 28 between ridges 22.

The height of the meniscus of liquid material 24 is reduced upon drying and/or curing to leave a thin layer covering coating 26 in areas 28 between ridges 22. Proper selection of the height of ridges 22 and percent solids of material 24 will leave a precisely controlled layer of the material after drying. Furthermore, the meniscus of material 24 can be controlled to various heights on the side of ridges 22, allowing for the removal of coating 26 over the edge of ridges 22 and along the upper edge of the side walls of the ridge structure, as shown in FIG. 2D.

Figure 2D:
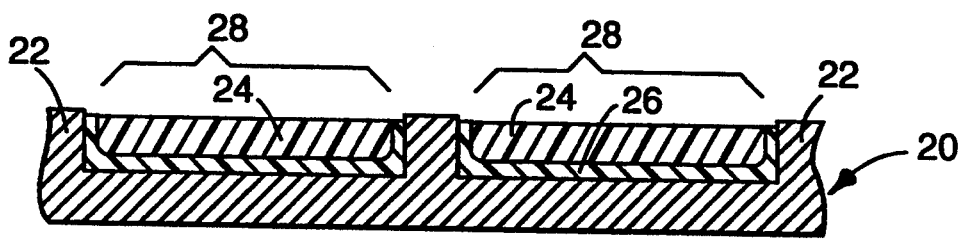

The portions of coating 26 that are exposed, i.e., those portions on the tops of ridges 22, and portions of side walls not covered by the material 24 are then removed, as shown in FIG. 2D. This may be done by conventional techniques such as chemical etching.

Figure 2E:
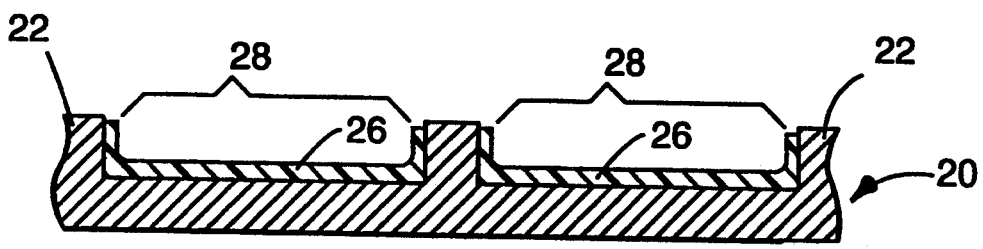

Material 24 is then removed by conventional techniques, such as chemical stripping or blanket exposure and development, as shown in FIG. 2E. The result is that coating 26 remains only on areas 28 between ridges 22.

As shown in FIG. 2E, coating 26 is also removed from the top edge of the side walls of ridges 22. This may be advantageous where, for example, coating 26 is electrically conductive, because the removal of the coating from the top edge of the side walls of ridges 22 helps to ensure electrical isolation between adjacent conductive strips, as well as between bilevel substrate 20 and any other substrate brought into contact with the bilevel substrate.

Substrates 10 and 20 may be any flexible or rigid material such as, but not limited to, plastic, glass, metal or ceramic. Substrates 10 and 20 may also be one of a pair of panels that comprise a liquid crystal display. Channels 12 preferably have a depth within the range of from about 1 $\mu$m to 100 $\mu$m, more preferably 1 to 10 $\mu$m, a width in the range of from about 1 $\mu$m to 1 mm, more preferably 10 to 50 $\mu$m, and a spacing between the channels within the range of from about 1 $\mu$m to 1 mm, more preferably 50 to 500 $\mu$m. Ridges 22 preferably have heights, widths, and spacings within the same ranges discussed above for the depths, widths, and spacings, respectively, of channels 12. In the alternative, ridges 22 may take the form of protrusions so long as the tops of the protrusions provide a planar upper surface which may be used as the leveling surface to meter the thickness of liquid material 24.

Those skilled in the art will appreciate that coating 16 should be thin enough to permit material 14 to be removed by the etchant. Coating 26 should preferably have a thickness less than the height of ridges 22, more preferably less than 10%, and most preferably about 2% of the height of the ridges.

Although the present invention has been described with reference to preferred embodiments, workers skilled in the art will recognize that changes may be made in form and detail without departing from the spirit and scope of this invention. For example, although this invention has been described with reference to a ridged or channeled substrate, the present invention may be applied to any bilevel substrate having a substantially planar upper surface. And while the ridges and channels have been described as rectangular in shape and parallel to each other, they can have sloped or curved side walls and need not be parallel to each other. While the coatings have been described as transparent and electrically conductive, they may be opaque and not electrically conductive, and may include adhesives, insulators, metals, ceramics, etc.

I claim:

1. A method for applying a coating to the upper surface of a bilevel substrate, comprising the steps of:
   providing a bilevel substrate having a planar upper surface and at least one channel therein forming a lower surface;
   applying a layer of liquid material on the upper and lower surfaces of the bilevel substrate;
   moving a leveling device across the upper surface, whereby the liquid material on the upper surface of the bilevel substrate is removed while the liquid material on the lower surface of the bilevel substrate is not;
   hardening the liquid material on the lower surface;
   depositing a coating on the planar upper surface and over the hardened material on the lower surface of the bilevel substrate; and
   removing the hardened material, and the coating above the hardened material, on the lower surface of the bilevel substrate, whereby the coating remains on the upper surface of the bilevel substrate.

2. The method of claim 1, wherein the bilevel substrate further comprises a plurality of parallel channels.

3. The method of claim 2, wherein the distance between adjacent channels is less than about 1 mm.

4. The method of claim 3, wherein the substrate is a component of a liquid crystal display panel.

5. The method of claim 1, wherein the coating is electrically conductive.

6. The method of claim 1, wherein the coating is an adhesive.

7. A method of applying an electrically conductive coating to a liquid crystal display panel, comprising the steps of:
provide a liquid crystal display panel having a planar surface and a plurality of channels therein;
applying a layer of photosensitive material on the planar surface and the channels of the panel:
moving a leveling device across the planar surface, whereby the photosensitive material on the planar surface is removed while the photosensitive material in the channels is not;
hardening the photosensitive material in the channels;
depositing an electrically conductive coating on the planar surface and over the photosensitive material in the channels; and
removing the photosensitive material and the coating from the channels, whereby the coating remains on the planar surface.

8. A method of applying a coating to the lower surface of a bilevel substrate, comprising the steps of:
providing a bilevel substrate having a lower surface and an upper surface comprised of a plurality of protrusions, the tops of which are coplanar;
applying a coating to the upper and lower surfaces of the bilevel substrate;
applying a layer of liquid material over the coating on the bilevel substrate;
moving a leveling device across the coated bilevel substrate, whereby the liquid material above the upper surface of the bilevel substrate is removed while the liquid material above the lower surface of the bilevel substrate is not;
hardening the liquid material;
removing those portions of the coating that are not covered by the hardened material, said portions being on top of the upper surface of the bilevel substrate; and
removing the hardened material on the lower surface of the bilevel substrate, whereby the coating remains on the lower surface of the bilevel substrate.

9. The method of claim 8, wherein the protrusions comprise parallel ridges.

10. The method of claim 9, wherein the distance between adjacent ridges is less than about 1 mm.

11. The method of 10, wherein the substrate is a component of a liquid crystal display panel.

12. The method of claim 8, wherein the coating is electrically conductive.

13. A method of applying an electrically conductive coating between ridges on a liquid crystal display panel, comprising the steps of:
providing a liquid crystal display panel having a plurality of flat-topped, coplanar ridges;
applying an electrically conductive coating on and between the ridges on the panel;
applying a layer of photosensitive material over the coating on the panel;
moving a leveling device across the coating, whereby the photosensitive material above the ridges is removed while the photosensitive material between the ridges is not;
hardening the photosensitive material between the ridges;
removing those portions of the coating that are not covered by the hardened photosensitive material, said portions being on top of the ridges; and
removing the hardened photosensitive layer whereby the coating remains on the portions of the panel between the ridges.

14. The method of claim 13, wherein the photosensitive material is photoresist.

15. The method of claim 13, wherein the coating is indium tin oxide.

16. The method of claim 13, wherein the step of removing those portions of the coating that are not covered by the photosensitive material comprises chemically etching away the coating.

* * * * *